(12) United States Patent
Adam et al.

(10) Patent No.: US 11,172,595 B2
(45) Date of Patent: Nov. 9, 2021

(54) REMOTE TUNER MODULE WITH IMPROVED THERMAL PROPERTIES

(71) Applicant: Hirschmann Car Communication GmbH, Neckartenzlingen (DE)

(72) Inventors: Thomas Adam, Bad Urach (DE); Wolfgang Sautter, Reutlingen (DE); Uwe Daum, Filderstadt (DE); David Silva, Nurtingen (DE); Ralf Amler, Großbettlingen (DE)

(73) Assignee: Hirschmann Car Communication GmbH, Neckartenzlingen (DE)

( * ) Notice: Subject to any disclaimer, the term of this patent is extended or adjusted under 35 U.S.C. 154(b) by 0 days.

(21) Appl. No.: 16/662,646

(22) Filed: Oct. 24, 2019

(65) Prior Publication Data

US 2020/0060049 A1 Feb. 20, 2020

Related U.S. Application Data

(63) Continuation of application No. PCT/EP2018/059736, filed on Apr. 17, 2018.

(30) Foreign Application Priority Data

Apr. 24, 2017 (DE) .......................... 102017108638.2

(51) Int. Cl.
*H05K 7/20* (2006.01)
*H04B 1/08* (2006.01)
(Continued)

(52) U.S. Cl.
CPC ......... *H05K 7/20854* (2013.01); *H04B 1/082* (2013.01); *H05K 1/0209* (2013.01);
(Continued)

(58) Field of Classification Search
CPC ............ H05K 7/20854; H05K 7/2039; H05K 1/0203; H05K 1/0243; H05K 1/0209; H05K 1/181
See application file for complete search history.

(56) References Cited

U.S. PATENT DOCUMENTS 5,060,114 A * 10/1991 Feinberg ............ H05K 7/20454
361/706
2007/0139904 A1* 6/2007 English ................ H05K 9/0032
361/818
(Continued)

FOREIGN PATENT DOCUMENTS

CN 101645700 A 2/2010
CN 102164468 A 8/2011
(Continued)

OTHER PUBLICATIONS

PCT International Search Report and Written Opinion, English translation, International App No. PCT/EP2018/059736, dated Jun. 15, 2018, 17 pages.

(Continued)

*Primary Examiner* — Mukundbhai G Patel
(74) *Attorney, Agent, or Firm* — Barley Snyder

(57) ABSTRACT

A tuner includes a housing including an upper housing part and a lower housing part, a printed circuit board arranged in the housing, and an electronics component arranged on the printed circuit board. A region of at least one of the upper housing part and the lower housing part is a heat-conductive material and the electronics component is connected to the region in a heat-transmitting manner.

17 Claims, 2 Drawing Sheets

(51) Int. Cl.
*H05K 1/02* (2006.01)
*H05K 1/18* (2006.01)

(52) U.S. Cl.
CPC .......... *H05K 1/0243* (2013.01); *H05K 1/181* (2013.01); *H05K 2201/10098* (2013.01)

(56) References Cited

U.S. PATENT DOCUMENTS

| | | | | |
|---|---|---|---|---|
| 2009/0086437 | A1* | 4/2009 | Tsuyuno | H05K 7/20454 361/709 |
| 2011/0205710 | A1* | 8/2011 | Kondo | H05K 7/20436 361/714 |
| 2012/0307453 | A1 | 12/2012 | Yan et al. | |
| 2012/0307455 | A1* | 12/2012 | Ritter | H05K 7/20445 361/720 |
| 2015/0289357 | A1* | 10/2015 | Wakana | H05K 1/181 174/535 |

FOREIGN PATENT DOCUMENTS

| | | |
|---|---|---|
| CN | 106251597 A | 12/2016 |
| EP | 0806851 A2 | 11/1997 |

OTHER PUBLICATIONS

Abstract of EP 0806851, dated Nov. 12, 1997, 2 pages.
Chinese Office Action and English translation, dated Nov. 2, 2020, 17 pages.
Abstract of CN 106251597, dated Dec. 21, 2016, 1 page.
Abstract of CN 101645700, dated Feb. 10, 2010, 1 page.

* cited by examiner

REMOTE TUNER MODULE WITH IMPROVED THERMAL PROPERTIES

CROSS-REFERENCE TO RELATED APPLICATIONS

This application is a continuation of PCT International Application No. PCT/EP2018/059736, filed on Apr. 17, 2018, which claims priority under 35 U.S.C. § 119 to German Patent Application No. 102017108638.2, filed on Apr. 24, 2017.

FIELD OF THE INVENTION

The present invention relates to a tuner and, more particularly, to a tuner for the mobile reception of radio frequency signals.

BACKGROUND

Tuners for the mobile reception of radio frequency signals in vehicles have a housing for the intended arrangement and fastening at their installation site. The housing is formed by a first housing part and at least one further housing part. At least one printed circuit board is arranged in the housing. At least one heat-critical electronics component, for a sub-function of the tuner, is arranged on the printed circuit board. Additional components of the tuner such as further electronics components, plug connections, mechanical components and the like are present, which can also be heat-critical, but do not have to be heat-critical.

At the intended installation site of the tuner inside a vehicle, very high temperatures prevail, depending on the external conditions, in particular as a result of solar irradiation or heat build-up, and these very high temperatures can lead either to impairment of the functioning of the tuner or even to a complete breakdown. The impairments or the breakdown can take place intentionally by switching off sub-functions or the entire tuner, but damage and breakdowns can also arise as a consequence of the high temperatures, which in the worst case make replacement of the entire tuner necessary.

A remote radio tuner module is fitted in the immediate vicinity of one or more antennas. The antennas in this case are situated most usually in/on the "outer skin" of a vehicle (e.g. windscreen antennas), outside the vehicle (e.g. mirror antennas, roof antennas, smart antennas) or directly beneath the bodywork (e.g. bumpers or so-called smart bars).

Most construction spaces have several technical challenges in common. These are firstly the extremely small construction space available, the processing of digital and analogue RF signals in the immediate vicinity of various receiving antennas (EMC), and also the heat caused in the interior of the housing of the tuner by solar irradiation and intrinsic heating of the electronics components (ICs).

In the construction spaces mentioned by way of example, in particular immediately beneath the roof as well as in the region of the windscreen antennas, extreme temperatures in the region of up to approximately 105° C. prevail, depending on the area, season, and solar irradiation. A tuner in operation, or at least in limited operation, must be able to withstand these temperatures. The tuner modules from the motor vehicle industry which are available today for this purpose are largely specified in the range from −40° C. to +85° C., and thus disadvantageously are certainly not designed for these construction spaces. The much more important technical parameter for the ICs which should be noted, however, regarding the maximum possible environmental temperature, is the junction temperature. This is typically 125° C. and must not be exceeded. The object of a tuner design therefore consists in dealing with these basic conditions.

European Patent Application No. 0806851 A2 discloses a radio receiving system for a vehicle with input/output units, which in principle possesses several receiving units which are configured to be remote from the input/output unit. The receiving units are connected to one another and to the input/output unit via a connection line for digital signals. The receiving units and the associated antennas are arranged in close spatial proximity to one another. Furthermore, in the application it is described that the antenna signal received via the antenna and fed to the radio receiver via the antenna line is demodulated and evaluated for quality in the tuner part, adapted in the signal processing unit and conducted in an amplified state to the outputs. It is also described that the radio receiving system is configured as a decentralized system, which possesses an input/output unit and several receiving units remote therefrom. Each one of the receiving units shows a control unit, a tuner part, and a signal processing unit with digital interface and also at least one antenna associated with it.

By the decentralized arrangement of the receiving units, it is possible to bring the function successfully to the appropriate position. Furthermore, in the region of the dashboard of the vehicle, there is always an enormous lack of space on account of the user's need to operate a wide range of devices. The requirements with regards to temperature and EMC are many times higher and more difficult to handle for the remote tuner, which is now fitted directly on the antenna in the aforementioned construction spaces.

SUMMARY

A tuner includes a housing including an upper housing part and a lower housing part, a printed circuit board arranged in the housing, and an electronics component arranged on the printed circuit board. A region of at least one of the upper housing part and the lower housing part is a heat-conductive material and the electronics component is connected to the region in a heat-transmitting manner.

BRIEF DESCRIPTION OF THE DRAWINGS

The invention will now be described by way of example with reference to the accompanying Figures, of which.

DETAILED DESCRIPTION OF THE EMBODIMENT(S)

Figure 1:
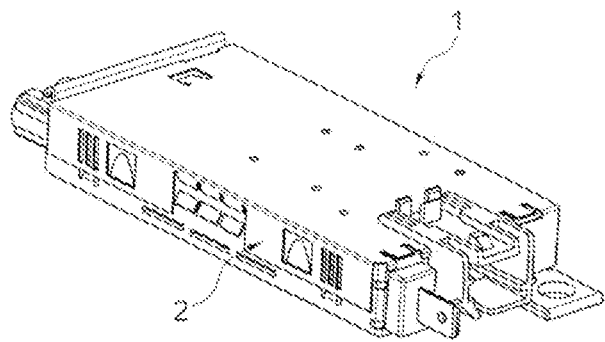
FIG. 1 is a perspective view of a first end of a tuner according to an embodiment.

The present disclosure will be described in further detail with reference to the following embodiments, taken in conjunction with the accompanying drawings. In the specification, the same or similar references indicate the same or similar components. The following description of embodiments of the present disclosure with reference to the accompanying drawings is intended to explain the general inventive concept of the present disclosure and should not be construed as limiting the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
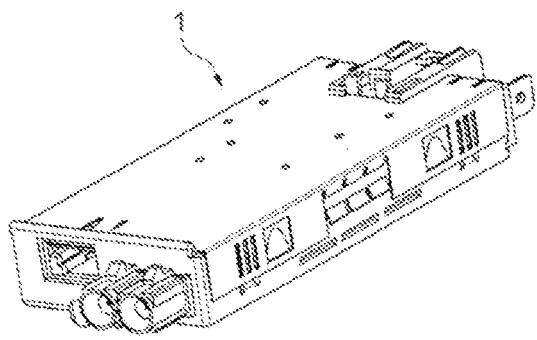
FIG. 2 is a perspective view of a second end of the tuner.
Figure 3:
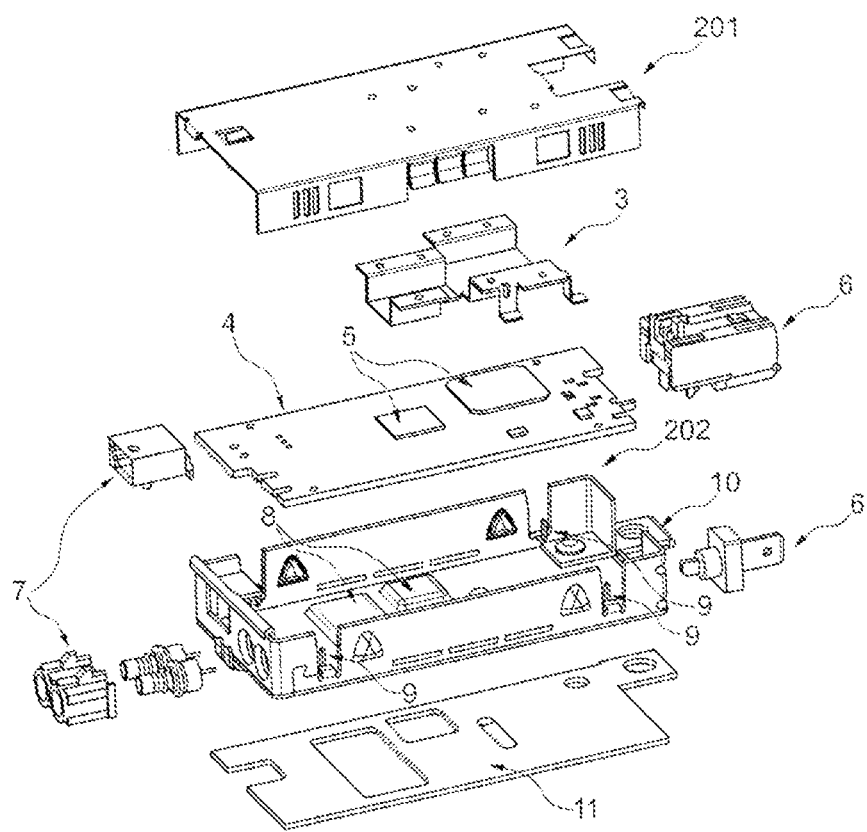
FIG. 3 is an exploded perspective view of the tuner.

A tuner 1 according to an embodiment, as shown in FIGS. 1-3, has a housing 2. The housing 2 includes two housing parts, an upper housing part 201 and a lower housing part 202 as shown in FIG. 3. The housing parts 201, 202 are each composed of a material with high heat conductivity, these housing parts 201, 202 spread the heat from the interior of the housing 2 of the tuner 1 and emit it to the outside, by various measures described hereinbelow. In an embodiment, the tuner 1 is used for the mobile reception of radio frequency signals in vehicles.

In an embodiment shown in FIG. 3, the tuner 1 includes a separate heat-conducting element 3 in the interior of the housing 2. The separate heat-conducting element 3 cools an electronics component 5 arranged on a printed circuit board 4; the separate heat-conducting element 3 is connected to the electronics component 5 in a heat-coupling manner. The separate heat-conducting element 3 is composed of a heat-conductive material, such as, for example, a steel sheet, an aluminum sheet, a plastic with high heat conductivity, or the like, and absorbs the heat of the electronics component 5, conducts it further for example to the printed circuit board 4 and/or to one of the housing parts 201, 202, in order to cool the electronics component 5. In the shown embodiment, not only a single electronics component 5 is present, but rather it is also possible for several electronics components 5 to be connected to the separate heat-conducting element 3.

As shown in FIG. 3, the tuner 1 includes a first plug connector 6 for the supply of power and the transmission of signals for the tuner 1, and a second plug connector 7 for an antenna terminal of the tuner 1.

As shown in FIG. 3, for the thermal linking, planar elevations 8 are present, which extend into the interior of the housing 2, and protrude from the lower housing part 202. In an embodiment, the planar elevations 8 are present at exactly the locations at which an electronics component 5 is situated. In other embodiments, it is conceivable to thermally couple not an electronics component 5, but rather a sub-region of the printed circuit board 4 to the housing 2 via these inwardly pointing planar elevations 8. In an embodiment, a surface of the planar elevation 8 is precisely the same size as the surface of the electronics component 5, but the surfaces can be different sizes in other embodiments.

For heat dissipation, as shown in FIG. 3, a plurality of housing heat-conducting elements 9 are present and formed by the lower housing part 202. These housing heat-conducting elements 9 are configured as fastening pins extending into the interior of the housing 2. The housing heat-conducting elements 9 interact with corresponding apertures in the printed circuit board 4. The printed circuit board 4 can be placed onto the housing heat-conducting elements 9 configured as fastening pins via its corresponding apertures. Thereafter, a materially bonded and/or positive connection of the housing heat-conducting element 9 to the printed circuit board 4 takes place. The materially bonded connection can take place by soldering, for example. In other embodiments, another positive connection such as caulking, grouting or the like can be used.

To further enhance the dissipation of heat from the interior of the housing 2 to the outside, in an embodiment, the inner contour of the side walls of the lower housing part 2 corresponds to some edge regions of the printed circuit board 4, that is to say the outer contour thereof, so that parts of the edge regions of the printed circuit board 4 come to bear on the inner flanks of the lower housing part 202 in a heat-coupling manner. In an embodiment, the edge regions of the printed circuit board 4 are materially bonded and/or positively connected to the housing 2. In an embodiment, an entire circumferential region of the printed circuit board 4 is used for heat coupling.

The above-described measures for the heat-transmitting coupling of elements of the tuner 1 can be assisted by a flexible heat-conductive material, such as for example a heat-conducting gel, a heat-conducting pad, a heat-conductive adhesive or the like, being arranged between the regions bearing upon one another.

To fasten the housing 2 of the tuner 1 to its intended installation site, as shown in FIG. 3, the tuner 1 has at least one screw tab 10, which points outwards. The screw tab 10 has an aperture, through which a fastening screw is passed, which can be screwed into a component at the installation site of the tuner 1, for example a part of the bodywork of the vehicle. Via this screw tab 10 and the fastening screw which interacts therewith, there takes place not only a permanent fastening but also an electrical ground connection, and above all, as a result, a further transmission of heat, spreading of heat and emission from the interior of the housing 2 to the vehicle component. In an embodiment, a width of the screw tab 10 is at least twice as large as a largest diameter of a screw with which the screw tab 10 interacts.

A further spreading of heat, transmission of heat, and heat coupling can take place through a heat-conducting pad 11 shown in FIG. 3. The heat-conducting pad 11 is arranged between at least one housing part, here the lower housing part 202, and a component of the vehicle. The heat-conducting pad 11, configured as a heat-conducting pad for example, is formed in a planar manner, spreading of the heat and thus coupling and emission of the heat from the housing 2 to the vehicle component takes place over a large area. The heat-conducting pad 11 depicted in the exemplary embodiment has at least two, for example rectangular, recesses, which are arranged in the region in which the surfaces or elevations 8 pointing into the interior of the housing 2, for thermal linking to the electronics component 5, are situated. These surfaces are recessed from the heat-conducting pad 11, because they are provided outwardly with a heat-radiating coating, such as with a paint of high emissivity or an anodization for example; the covering of these surfaces 8 with the heat-conducting pad 11 would work against the emission of heat outwards. In an embodiment, the heat-conducting pad 11 is adhesively bonded to the lower housing part 202.

In an embodiment, the heat-conducting pad 11 has a size matching a surface of the lower housing part 202. The heat-conducting pad 11 may have a uniform thickness or a thickness that matches a geometry of a component at an installation site of the tuner 1. As a result, unevenness (for example on account of tolerances or existing unevenness, curvatures and the like) can be compensated, in order to obtain a targeted spreading of heat through the housing part 202 in the direction of the component via the heat-conducting pad 11, and as a result to dissipate the heat out of the interior of the housing 2 not only via the housing part 202, but additionally via the component at the installation site.

In an embodiment, a communication system of a vehicle has an antenna for receiving radio frequency signals and the tuner 1. The tuner 1 is attached to the antenna and arranged adjacent to the antenna. In an embodiment, the radio frequency signals received by the antenna are prepared inside the tuner 1 and emitted via an interface of the tuner for further processing. The interface can be of any type, low-frequency analogue signals and/or digital signals being provided at this interface, for further processing by downstream electronic units.

What is claimed is:

1. A tuner, comprising:
   a housing including an upper housing part, a lower housing part, and a plurality of heat-conducting elements formed by the lower housing part and extending into an interior of the housing;
   a printed circuit board arranged in the housing and supported on the plurality of heat-conducting elements for directly coupling the circuit board to the housing;
   a separate heat-conducting element connected to the housing and the electronics component in a heat-conducting manner and arranged inside the housing and between the upper housing part and a side of the circuit board facing the upper housing part; and
   an electronics component arranged on the printed circuit board, a region of at least one of the upper housing part and the lower housing part is a heat-conductive material and the electronics component is connected to the region in a heat-transmitting manner.

2. The tuner of claim 1, wherein the upper housing part and the lower housing part are each formed of the heat-conductive material.

3. The tuner of claim 1, wherein an outer surface of the housing has a coating made of a heat-radiating material.

4. The tuner of claim 3, wherein the coating is formed by a paint of high emissivity or anodization.

5. The tuner of claim 1, wherein the plurality of housing heat-conducting elements are materially bonded to the printed circuit board.

6. The tuner of claim 5, wherein an edge region of the printed circuit board is directly materially bonded and/or directly positively connected to the housing.

7. The tuner of claim 1, wherein the housing has a planar elevation extending into an interior of the housing.

8. The tuner of claim 7, wherein the planar elevation is situated adjacent the electronics component.

9. The tuner of claim 8, wherein the electronics component is connected to the planar elevation by a flexible heat-conducting material.

10. The tuner of claim 1, wherein the electronics component is connected to the housing and/or to the separate heat-conducting element by a flexible heat-conducting material.

11. The tuner of claim 1, further comprising a heat-conducting pad disposed on an outer surface of the housing.

12. The tuner of claim 11, wherein the heat-conducting pad is connected to a component at an installation site of the tuner in a heat-transmitting manner.

13. The tuner of claim 1, wherein the housing has a protruding screw tab.

14. The tuner of claim 13, wherein a width of the screw tab is at least twice as large as a largest diameter of a screw with which the screw tab interacts.

15. The tuner of claim 1, wherein the printed circuit board comprises a plurality of apertures, and wherein the plurality of heat-conducting elements comprise a plurality of fastening pins received by the plurality of apertures for supporting the printed circuit board within the housing.

16. A communication system of a vehicle, comprising:
    an antenna receiving a plurality of radio frequency signals;
    a tuner attached to the antenna and arranged adjacent to the antenna, the tuner including a housing having:
       an upper housing part and a lower housing part, the lower housing part defining a plurality of planar elevations extending into an interior of the housing;
       a printed circuit board arranged in the housing; and
       an electronics component arranged on the printed circuit board, a region of at least one of the upper housing part and the lower housing part is a heat-conductive material and the electronics component is connected to the region in a heat-transmitting manner; and
    a heat-conducting pad disposed on an outer surface of the lower housing part, the heat-conducting pad including a plurality of recesses formed into the pad in a direction away from the interior of the housing and corresponding in location to the plurality of planar elevations.

17. A vehicle comprising:
    a communication system including an antenna receiving a plurality of radio frequency signals and a tuner attached to the antenna and arranged adjacent to the antenna, the tuner including a housing having:
    an upper housing part, a lower housing part, and a plurality of heat-conducting elements extending into an interior of the housing from the lower housing part, the lower housing part defining a planar elevation extending into an interior of the housing;
    a printed circuit board supported within the housing on the plurality of heat-conducting elements for directly thermally coupling the circuit board to the housing, an edge region of the printed circuit board directly materially bonded and/or directly positively connected to the housing;
    an electronics component arranged on the printed circuit board, a region of at least one of the upper housing part and the lower housing part is a heat-conductive material and the electronics component is connected to the region in a heat-transmitting manner;
    a separate heat-conducting element arranged between and contacting the upper housing part and the electronics component; and
    a heat-conducting pad disposed on the housing and including a recess formed therein corresponding in location to the planar elevation and extending into the pad in a direction away from the interior of the housing.

* * * * *